United States Patent
Grellat et al.

(10) Patent No.: US 10,659,104 B2
(45) Date of Patent: May 19, 2020

(54) METHOD FOR DIAGNOSING A COMMUNICATION LINK IN A MOTOR VEHICLE

(71) Applicants: Continental Automotive France, Toulouse (FR); Continental Automotive GmbH, Hannover (DE)

(72) Inventors: Laurent Grellat, Auterive (FR); Frédéric Loiselle, Villeneuve Tolosane (FR); Laurent Vaysset, La Salvetat Saint Gilles (FR)

(73) Assignees: Continental Automotive France (FR); Continental Automotive GmbH (DE)

( * ) Notice: Subject to any disclaimer, the term of this patent is extended or adjusted under 35 U.S.C. 154(b) by 0 days.

(21) Appl. No.: 16/339,784

(22) PCT Filed: Nov. 28, 2017

(86) PCT No.: PCT/FR2017/053274
§ 371 (c)(1),
(2) Date: Apr. 5, 2019

(87) PCT Pub. No.: WO2018/100285
PCT Pub. Date: Jun. 7, 2018

(65) Prior Publication Data
US 2020/0044690 A1 Feb. 6, 2020

(30) Foreign Application Priority Data
Nov. 30, 2016 (FR) ...................................... 16 61679

(51) Int. Cl.
*H04B 3/46* (2015.01)
*G01R 31/00* (2006.01)
*H01Q 1/32* (2006.01)

(52) U.S. Cl.
CPC ............. *H04B 3/46* (2013.01); *G01R 31/006* (2013.01); *H01Q 1/325* (2013.01)

(58) Field of Classification Search
CPC ......... H04B 3/46; H01Q 1/325; G01R 31/006
(Continued)

(56) References Cited

U.S. PATENT DOCUMENTS

| | | | | |
|---|---|---|---|---|
| 5,977,920 A * | 11/1999 | Hung | ........................ | H01Q 9/16 343/715 |
| 6,437,577 B1 * | 8/2002 | Fritzmann | ................ | H01Q 1/32 324/523 |

(Continued)

FOREIGN PATENT DOCUMENTS

EP          3076562 A2     10/2016

OTHER PUBLICATIONS

English Translation of the Written Opinion for International Application No. PCT/FR2017/053274, dated Jan. 16, 2018, 4 pages.
(Continued)

*Primary Examiner* — Hirdepal Singh
(74) *Attorney, Agent, or Firm* — RatnerPrestia

(57) ABSTRACT

A method for diagnosing the status of a communication link between an interior relay antenna and an exterior relay antenna of a motor vehicle. The method includes measuring a first voltage value defined between the midpoint of the electrical circuit and the second ground when the switch is in the open position, measuring a second voltage value defined between the midpoint of the electrical circuit and the second ground when the switch is in the closed position, calculating the value of the variable resistor from the first measured voltage value, from the second measured voltage value, from the value of the voltage defined across the terminals of the voltage source and from the values of the first resistor and of the second resistor, and diagnosing the
(Continued)

status of the communication link on the basis of the calculated value of the variable resistor.

12 Claims, 2 Drawing Sheets

(58) Field of Classification Search
 USPC .......................................................... 375/224
 See application file for complete search history.

(56) References Cited

U.S. PATENT DOCUMENTS

| | | | | |
|---|---|---|---|---|
| 6,784,847 | B2* | 8/2004 | Ngo Bui Hung | H01Q 1/246 343/715 |
| 7,791,493 | B2* | 9/2010 | Ikeura | H01Q 1/3241 340/635 |
| 9,274,156 | B2* | 3/2016 | Petrucci | G01R 31/006 |
| 10,390,317 | B2* | 8/2019 | Peitzer | H04W 52/52 |
| 2006/0273956 | A1* | 12/2006 | Kondo | G01S 19/36 342/357.57 |
| 2008/0309566 | A1* | 12/2008 | Russ | G07Q 9/00309 343/703 |
| 2013/0088954 | A1 | 4/2013 | Sakamoto et al. | |
| 2015/0171510 | A1 | 6/2015 | Hirose | |
| 2018/0138966 | A1* | 5/2018 | Ishiko | H04B 7/1555 |
| 2018/0212667 | A1* | 7/2018 | Chen | H04B 17/318 |
| 2019/0222258 | A1* | 7/2019 | Bohls | H04B 3/30 |
| 2019/0349025 | A1* | 11/2019 | Murakami | H01Q 1/3275 |

OTHER PUBLICATIONS

International Search Report and Written Opinion for International Application No. PCT/FR2017/053274, dated Jan. 16, 2018—6 pages.

* cited by examiner

METHOD FOR DIAGNOSING A COMMUNICATION LINK IN A MOTOR VEHICLE

CROSS REFERENCE TO RELATED APPLICATIONS

This application is the U.S. National Phase Application of PCT International Application No. PCT/FR2017/053274, filed Nov. 28, 2017, which claims priority to French Patent Application No. 1661679, filed Nov. 30, 2016, the contents of such applications being incorporated by reference herein.

FIELD OF THE INVENTION

The present invention pertains to the automotive field and relates more particularly to a method for diagnosing a communication link in a motor vehicle.

BACKGROUND OF THE INVENTION

Currently, it is known practice for a user to communicate data using his or her cell phone over a radiofrequency communication link via a terrestrial telecommunications network, for example a 2G, 3G or 4G network.

When the user is in a motor vehicle, the quality of the radiofrequency communication link may be significantly negatively affected, in particular if the vehicle is moving.

To partly overcome this drawback, it is known practice to fit a motor vehicle with an exterior relay antenna, mounted for example on the roof of the vehicle, allowing the transmission of the radiofrequency communication link between the base stations of the terrestrial telecommunications network and the cell phone of the user located in the passenger compartment of the vehicle to be improved. However, it is been observed that such an antenna may turn out not to be sufficient to effectively relay the communication over the radiofrequency communication link.

Thus, from one known solution for a motor vehicle 1A illustrated in FIG. 1, in order to allow communication between a user device 2 located in the vehicle 1A and a base station 3 of the terrestrial telecommunications network via an exterior relay antenna 4 mounted on the exterior of the vehicle 1A, it is now known practice to mount an interior relay antenna 5 that is connected by wire to the exterior relay antenna 4 inside the passenger compartment of the vehicle 1A. The system thus has three communication links: a radiofrequency communication link L1 between the base station 3 and the exterior relay antenna 4; a wired communication link L2 between the exterior relay antenna 4 and the interior relay antenna 5; and a radiofrequency communication link L3 between the interior relay antenna 5 and the user device 2.

Since the power of the signals received from the base station 3 decreases with increasing distance between the base station 3 and the exterior relay antenna 4, it is preferable for them to be amplified before they are transmitted to the interior relay antenna 5 and then on to the user device 2. To achieve this, it is known practice to use a signal amplifier module, referred to as a compensator 6, which is electrically connected between the exterior relay antenna 4 and the interior relay antenna 5. As is known, this compensator 6 also allows a diagnostic module 7 linked to the interior relay antenna 5 to diagnose the status of the communication link L2 linking the exterior relay antenna 4 and the interior relay antenna 5 in order to detect an operating fault on said communication link L2.

To achieve this, still with reference to FIG. 1, the compensator 6 includes a variable resistor RV, the value of which reflects the status of this communication link L2. By way of example, a first range of values of this variable resistor RV may indicate that the communication link L2 circuit is open between the interior relay antenna 5 and the compensator 6, a second range of values may indicate that the communication link L2 circuit is open between the compensator 6 and the exterior relay antenna 4, a third range of values may indicate that the communication link L2 circuit has shorted between the interior relay antenna 5 and the compensator 6, a fourth range of values may indicate that the communication link L2 circuit has shorted between the compensator 6 and the exterior relay antenna 4, and so on.

The value of the variable resistor RV is defined with respect to a first ground M1, for example the ground of the battery of the vehicle 1A, but it is measured by the diagnostic module 7 located at the interior relay antenna 5. For this, the diagnostic module 7 comprises an electrical circuit including an analog-to-digital converter 7-1, a resistor R1, a capacitor C and a microcontroller 7-2.

The resistor R1 is connected both to a voltage source Vcc and to the input E of the analog-to-digital converter 7-1. The capacitor C is connected both to the input E of the analog-to-digital converter 7-1 and to a second ground M2, this second ground M2 being different from the first ground M1, in particular for safety reasons. The analog-to-digital converter 7-1 converts the analog voltage that it receives as input E (i.e. the voltage V1 defined across the terminals of the capacitor C between the input E of the analog-to-digital converter 7-1 and the second ground M2) into a digital value that can be used by the microcontroller 7-2. The microcontroller 7-2 determines the status of the communication link L2 according to the digital value delivered by the analog-to-digital converter 7-1.

In this configuration, the value of the variable resistor RV is measured by the diagnostic module 7 with respect to the second ground M2. However, since the diagnostic module 7 is not aware of the difference in potential between the first ground M1 and the second ground M2, an error in the measurement of the value of the variable resistor RV, and hence in the digital value delivered by the analog-to-digital converter 7-1 to the microcontroller 7-2, results.

Such a measurement error may give rise to a diagnostic error in the case that the measured value of the variable resistor RV is close to two ranges of values corresponding to two different statuses of the communication link L2 and the diagnostic module 7 designates the range of values that does not actually correspond to the status of the communication link L2.

One obvious solution would consist in determining the potential value of the first ground M1 and in communicating this value to the diagnostic module 7, but such a solution has proven to be both complex and costly.

SUMMARY OF THE INVENTION

An aspect of the invention aims to at least partly overcome these drawbacks by providing a simple and effective solution so that the diagnostic module 7 accurately determines the value of the variable resistor RV of the compensator 6 so as to minimize, or even entirely remove, errors in diagnosing the status of the communication link L2 linking the exterior relay antenna 4 and the interior relay antenna 5.

To this end, a first aspect of the invention is a method for diagnosing the status of a communication link between an interior relay antenna mounted in the passenger compartment of a motor vehicle and an exterior relay antenna mounted on the body of said motor vehicle, the status of said communication link being determined by the value of the voltage defined across the terminals of a variable resistor that is connected both to an intermediate point of the communication link, located between the interior relay antenna and the exterior relay antenna, and to a first ground, said method being implemented by a diagnostic module comprising an electrical circuit including a midpoint that is connected to the interior relay antenna, a first resistor that is connected both to a voltage source and to said midpoint, and a capacitor that is connected both to the midpoint and to a second ground that is different from the first ground.

The method is noteworthy in that, with the diagnostic module further comprising a second resistor that is linked to the midpoint of the electrical circuit and connected in series with a switch linked to the voltage source, the method comprises the steps of measuring a first voltage value defined between the midpoint of the electrical circuit and the second ground when the switch is in the open position, of measuring a second voltage value defined between the midpoint of the electrical circuit and the second ground when the switch is in the closed position, and of calculating the value of the variable resistor from the first measured voltage value, from the second measured voltage value, from the value of the voltage defined across the terminals of the voltage source and from the values of the first resistor and of the second resistor in order to diagnose the status of the communication link.

The method according to an aspect of the invention thus allows the value of the variable resistor to be determined quickly and straightforwardly without the difference in voltage between the first ground and the second ground being known, in particular without the value of the first ground being known.

Preferably, the value of the variable resistor is calculated by solving a system of equations with two unknowns, which are the value of the voltage defined across the terminals of the variable resistor and the value of the difference in voltage between the first ground and the second ground according to the following equations:

$$V1 = V_{CC} \times \frac{RV}{R1 + RV} + (M1 - M2) \qquad (I)$$

$$V2 = V_{CC} \times \frac{RV}{\frac{R1 \times R2}{R1 + R2} + RV} + (M1 - M2)$$

Solving such a system of equations with two unknowns is straightforward and does not require significant processing capabilities.

An aspect of the invention also relates to a diagnostic module intended to be mounted in a motor vehicle so as to diagnose the status of a communication link between an interior relay antenna mounted in the passenger compartment of said motor vehicle and an exterior relay antenna mounted on the body of said motor vehicle, the status of said communication link being determined by the value of the voltage defined across the terminals of a variable resistor that is connected both to an intermediate point of the communication link, located between the interior relay antenna and the exterior relay antenna, and to a first ground.

The diagnostic module comprises an electrical circuit including a midpoint that is intended to be linked to the interior relay antenna, a first resistor that is connected both to a voltage source and said midpoint, and a capacitor that is connected both to the midpoint and to a second ground that is different from the first ground; an analog-to-digital converter, the input of which is connected to the midpoint of the electrical circuit, and a microcontroller, an input of which is connected to the output of the analog-to-digital converter so as to receive a digital value corresponding to an analog voltage measured between the midpoint and the second ground.

The diagnostic module is noteworthy in that it further comprises a second resistor that is linked to the midpoint of the electrical circuit and connected in series with a switch linked to the voltage source and means for switching the switch between an open position and a closed position, and in that the microcontroller is configured to calculate the value of the variable resistor from a first digital value received from the analog-to-digital converter when the switch is in the open state, from a second digital value received from the analog-to-digital converter when the switch is in the closed state, from the value of the voltage defined across the terminals of the voltage source and from the values of the first resistor and of the second resistor in order to diagnose the status of the communication link.

Preferably, the microcontroller is configured to calculate the value of the variable resistor by solving a system of equations with two unknowns, which are the value of the voltage defined across the terminals of the variable resistor and the value of the difference in voltage between the first ground and the second ground according to the following equations:

$$V1 = V_{CC} \times \frac{RV}{R1 + RV} + (M1 - M2) \qquad (I)$$

$$V2 = V_{CC} \times \frac{RV}{\frac{R1 \times R2}{R1 + R2} + RV} + (M1 - M2)$$

Further preferably, the switch comprises a transistor of MOSFET (metal-oxide-semiconductor field-effect transistor) type, which is inexpensive and straightforward to use.

According to one aspect of the invention, the switch comprises two Zener diodes that are connected via a common cathode, and the anodes of which are connected to the source and to the gate, respectively, of the MOSFET so as to switch the switch between an open position and a closed position in a straightforward manner.

Advantageously, the switch comprises a diode, the anode of which is connected to the drain of the MOSFET and the cathode of which is connected to the source of the MOSFET so as to switch the switch between an open position and a closed position in a straightforward manner.

According to one feature of an aspect of the invention, the means for switching the switch comprise an AC voltage source connected between the source and the gate of the MOSFET so as to switch the switch between an open position and a closed position in a straightforward manner.

Preferably, the values of the first resistor and of the second resistor, and the maximum value of the variable resistor, are equal so as to simplify the circuit and make solving the system of equations straightforward.

Lastly, an aspect of the invention relates to a motor vehicle comprising an interior relay antenna mounted in the passenger compartment of said motor vehicle, an exterior relay antenna mounted on the body of said motor vehicle, a communication link linking said interior relay antenna and said exterior relay antenna, a variable resistor that is connected both to an intermediate point of the communication link, located between the interior relay antenna and the exterior relay antenna, and to a first ground, and the value of the voltage of which, defined across its terminals, allows the status of said communication link to be determined, and a diagnostic module such as presented above, the midpoint of which is linked to the interior relay antenna.

BRIEF DESCRIPTION OF THE DRAWINGS

Other features and advantages of aspects of the invention will emerge during the following description, given with reference to the appended figures, which are given by way of non-limiting example and in which identical references are given to similar objects.

DETAILED DESCRIPTION OF THE PREFERRED EMBODIMENTS

Figure 1:
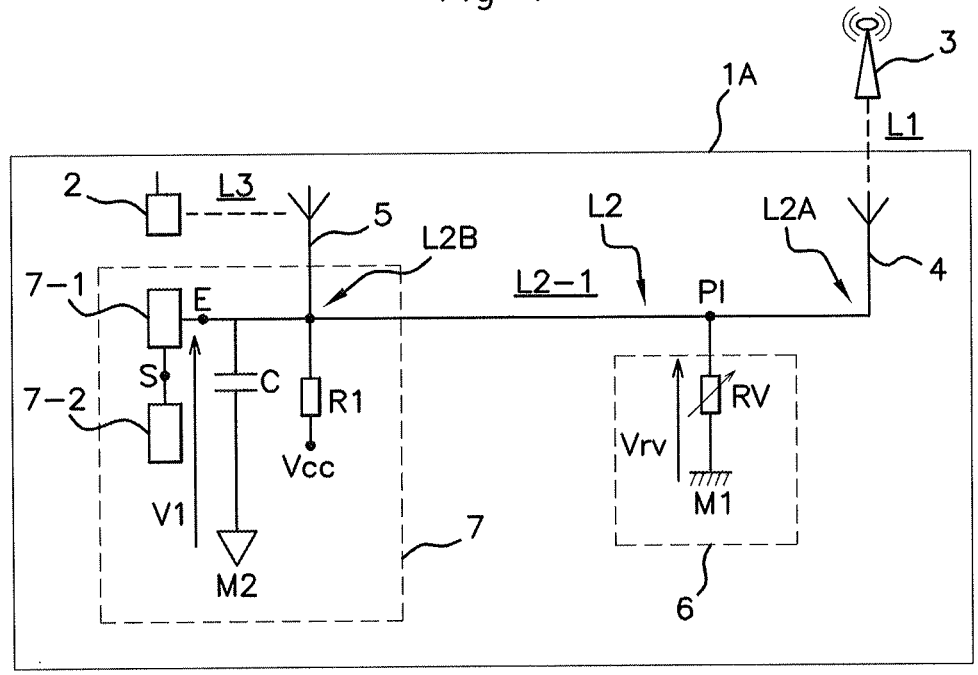
FIG. 1 (mentioned above) schematically illustrates a motor vehicle comprising a diagnostic module for diagnosing a communication link of the prior art.
Figure 2:
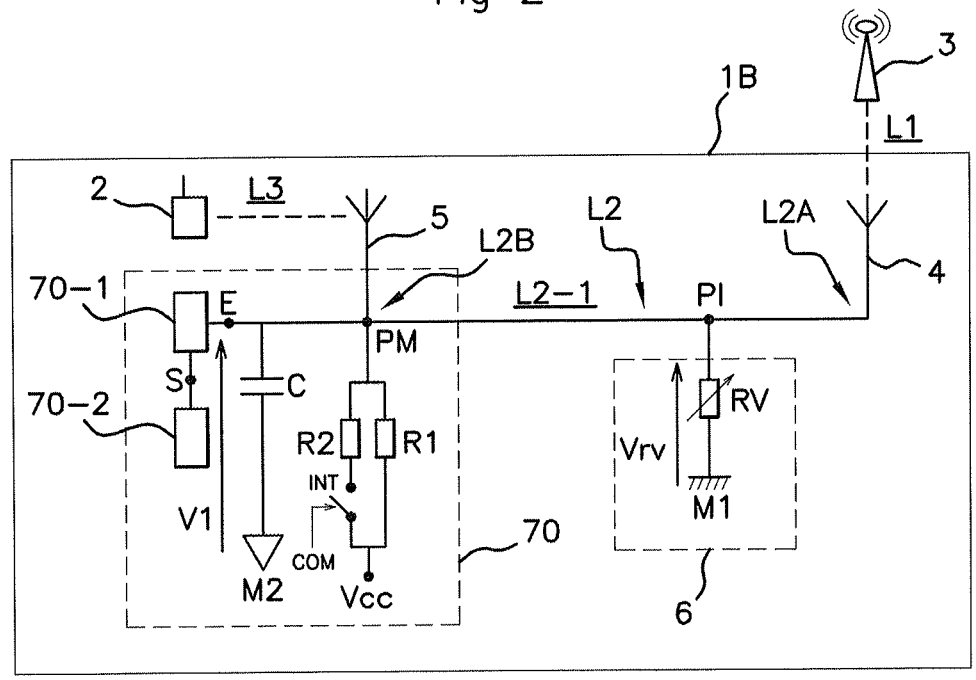
FIG. 2 schematically illustrates one embodiment of a motor vehicle comprising a diagnostic module according to an aspect of the invention in which the switch of the diagnostic module is in the open state.

FIG. 2 shows a motor vehicle 1B according to an aspect of the invention comprising a system allowing communication between a base station 3 of a terrestrial telecommunications network (not shown) and a user device 2, for example a smartphone, located in the vehicle 1B.

To this end, the vehicle 1B firstly comprises an exterior relay antenna 4, preferably mounted on the body (or more generally on the exterior structure) of the vehicle 1B, and an interior relay antenna 5 mounted in the passenger compartment of the vehicle 1B.

The exterior relay antenna 4 and the interior relay antenna 5 are electrically connected by wire, for example by means of a cable, a bus or an onboard network.

Three communication links are thus made to allow communication between the base station 3 and the user device 2: a radiofrequency communication link L1 between the base station 3 and the exterior relay antenna 4; a wired communication link L2 between the exterior relay antenna 4 and the interior relay antenna 5; and a radiofrequency communication link L3 between the interior relay antenna 5 and the user device 2. The wired communication link L2 links, via a first end L2A, the exterior relay antenna 4 and, via a second end L2B, the interior relay antenna 5.

Since the power of the signals received from the base station 3 decreases with increasing distance between the base station 3 and the exterior relay antenna 4, the vehicle 1B comprises a signal amplifier module, referred to as a compensator 6, which is electrically connected between the exterior relay antenna 4 and the interior relay antenna 5.

The vehicle 1B also comprises a diagnostic module 70 linked to the interior relay antenna 5 and allowing the status of the communication link L2 linking the exterior relay antenna 4 and the interior relay antenna 5 to be diagnosed in order to detect an operating fault on said communication link L2.

To this end, the compensator 6 includes a variable resistor RV, the value of which reflects the status of this communication link L2. This variable resistor RV is connected both to an intermediate point PI of the communication link L2, located between the interior relay antenna 5 and the exterior relay antenna 4, and to a first ground M1.

The value of the variable resistor RV allows the status of the communication link L2 to be diagnosed. To this end, the value of the variable resistor RV may be within distinct (i.e. non-superposed) value ranges, such as for example:

a first range of values indicating that the communication link L2 circuit is open between the interior relay antenna 5 and the compensator 6;

a second range of values indicating that the communication link L2 circuit is open between the compensator 6 and the exterior relay antenna 4;

a third range of values indicating that the communication link L2 circuit has shorted between the interior relay antenna 5 and the compensator 6;

and a fourth range of values indicating that the communication link L2 circuit has shorted between the compensator 6 and the exterior relay antenna 4.

The diagnostic module 70 is configured to determine the value of the voltage Vrv defined across the terminals of the variable resistor RV and thus to determine the status of the communication link L2 between the exterior relay antenna 4 and the interior relay antenna 5.

To this end, still with reference to FIG. 2, the diagnostic module 70 comprises an electrical circuit, a first resistor R1, a second resistor R2, a switch INT, means for switching said switch INT, a capacitor C, an analog-to-digital converter 70-1 and a microcontroller 70-2.

The first resistor R1 is connected both to a voltage source Vcc and to a midpoint PM that is connected to the interior relay antenna 5.

The second resistor R2 is both connected to the midpoint PM and connected in series with the switch INT linked to the voltage source Vcc.

The switch INT may for example be produced using a transistor of MOSFET (metal-oxide-semiconductor field-effect transistor) type.

Figure 4:
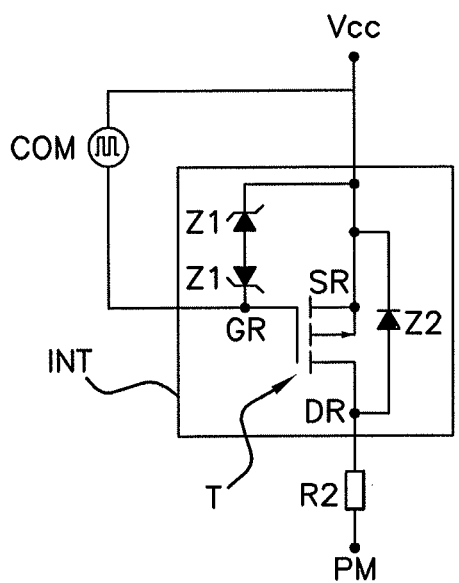
FIG. 4 schematically illustrates one embodiment of a switch of the diagnostic module according to an aspect of the invention.

In the example of FIG. 4, the switch INT comprises two Zener diodes Z1 that are connected via a common cathode, and the anodes of which are connected to the source SR and to the gate GR, respectively, of the transistor T of MOSFET type.

The source SR of the transistor T is connected to the voltage source Vcc while the drain DR of the transistor T is connected to the second resistor R2.

The switch INT comprises a diode Z2, the anode of which is connected to the drain DR of the transistor T and the cathode of which is connected to the source SR of the transistor T.

Figure 3:
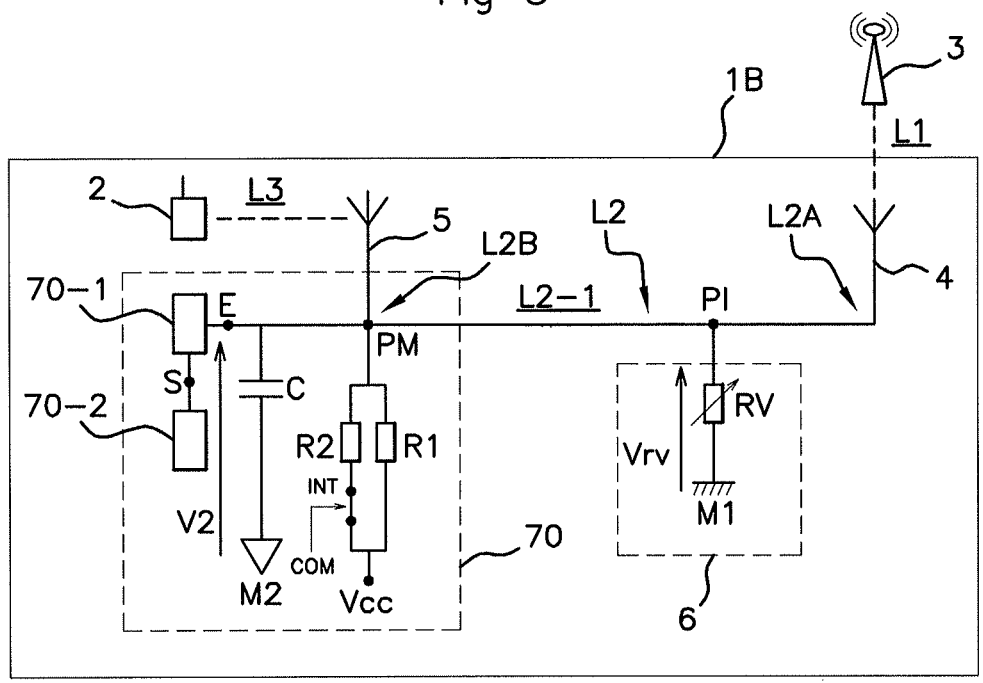
FIG. 3 schematically illustrates one embodiment of the motor vehicle comprising a diagnostic module according to an aspect of the invention in which the switch of the diagnostic module is in the closed state.

With reference to FIGS. 2 and 3, the variable resistor RV is connected to the midpoint PM of the voltage divider bridge via the portion L2-1 of the communication link L2 linking the intermediate point PI and the second end L2B of the communication link L2.

By way of example, the values of the first resistor R1 and of the second resistor R2 and the maximum value of the variable resistor RV may be equal.

The capacitor C is connected both to the midpoint PM and to a second ground M2, which is different from the first ground M1, for reasons of electrical safety on board the vehicle 1B.

The voltage measured across the terminals of the capacitor C between the midpoint PM and the second ground M2 corresponds to the sum of the voltage Vrv defined across the terminals of the variable resistor RV and of the difference in voltage between the first ground M1 and the second ground M2.

The input E of the analog-to-digital converter 70-1 is connected to the midpoint PM of a voltage divider bridge. This analog-to-digital converter 70-1 allows the analog voltage V1, V2 measured between the midpoint PM and the second ground M2 to be converted so that it can be used digitally by the microcontroller 70-2.

The microcontroller 70-2 is connected to the output S of the analog-to-digital converter 70-1 so as to read the digital values therefrom that it delivers as output, in particular when the switch INT is in the open position and then when the switch INT is in the closed position, successively.

The means for switching the switch INT allow it to be toggled, for example periodically, between an open position in which said switch INT prevents the current from flowing between the voltage source Vcc and the second resistor R2 and a closed state in which it allows the current to flow between the voltage source Vcc and the second resistor R2.

In the nonlimiting example of FIG. 4, the means for switching the switch INT comprise an AC voltage source COM that is connected between the source SR and the gate GR of the transistor T so as to allow it to be controlled. As a variant, it should be noted that these switching means could for example be controlled by the microcontroller 70-2 or be comprised within the microcontroller 70-2.

Thus, when the switch INT is open (FIG. 2), the first resistor R1 and the variable resistor RV constitute a first voltage divider bridge, which will give a first voltage value V1 across the terminals of the capacitor C, measured between the midpoint PM and the second ground M2.

Likewise, when the switch INT is closed (FIG. 3), the first resistor R1 connected in parallel with the second resistor R2 and the variable resistor RV constitute a second voltage divider bridge, which will give a second voltage value V2 across the terminals of the capacitor C, measured between the midpoint PM and the second ground M2.

The microcontroller 70-2 is configured to receive, from the analog-to-digital converter 70-1, a first digital value, corresponding to the first voltage value V1 defined between the midpoint PM of the voltage divider bridge and the second ground M2 when the switch INT is in the open position, and the second digital value corresponding to a second voltage value V2 defined between the midpoint PM of the voltage divider bridge and the second ground M2 when the switch INT is in the closed position.

The microcontroller 70-2 is also configured to calculate the value of the variable resistor RV of the compensator 6 from the first digital value, from the second digital value, from the value of the voltage defined across the terminals of the voltage source Vcc (measured with respect to the second ground M2) and from the values of the first resistor R1 and of the second resistor R2 in order to diagnose the status of the communication link L2.

More specifically, the microcontroller 70-2 is configured to calculate the value of the variable resistor RV by solving a system (I) of equations with two unknowns, which are the value of the voltage Vrv defined across the terminals of the variable resistor RV and the value of the difference in voltage between the first ground M1 and the second ground M2:

$$V1 = V_{CC} \times \frac{RV}{R1 + RV} + (M1 - M2) \qquad (I)$$

$$V2 = V_{CC} \times \frac{RV}{\frac{R1 \times R2}{R1 + R2} + RV} + (M1 - M2)$$

The first equation is defined on the basis of the first digital value (corresponding to the first voltage value V1 measured at the midpoint PM when the switch INT is in the open position).

The second equation is defined on the basis of the second digital value (corresponding to the second voltage value V2 measured at the midpoint PM when the switch INT is in the closed position for which the first resistor R1 and the second resistor R2 are then connected in parallel).

By way of nonlimiting example, the values of the first resistor R1, of the second resistor R2 and of the variable resistor RV may be equal, for example equal to 100 kΩ, the value of the capacitor C may be 100 nF, and the value of the supply voltage may be 3.3 V.

Figure 5:
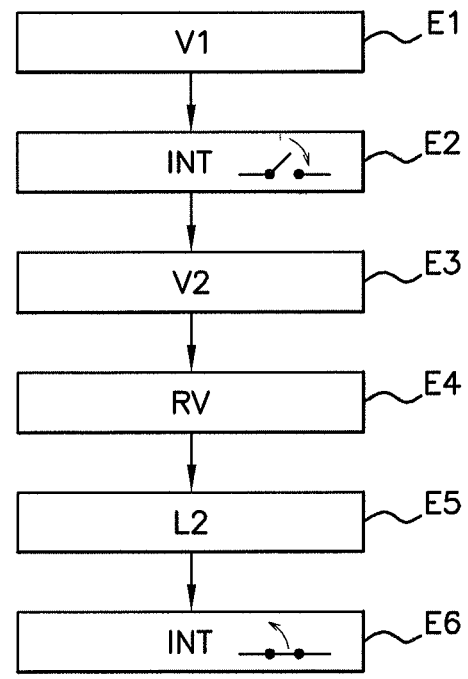
FIG. 5 schematically illustrates one embodiment of the method according to an aspect of the invention.

An aspect of the invention will now be described in its implementation with reference in particular to FIG. 5.

Firstly, it is assumed that the switching means have controlled the switch INT so that it is in the open position as illustrated in FIG. 2.

The microcontroller 70-2 then receives, in a step E1, the digital value output by the analog-to-digital converter 70-1, which corresponds to a first voltage value V1 defined between the midpoint PM of the voltage divider bridge and the second ground M2. In other words, the microcontroller 70-2 measures the first voltage value V1 via the analog-to-digital converter 70-1.

The switching means then control the switch INT so that it switches to its closed position in a step E2.

The microcontroller 70-2 then receives, in a step E3, the digital value output by the analog-to-digital converter 70-1, which corresponds to the second voltage value V2 defined between the midpoint PM of the voltage divider bridge and the second ground M2 when the switch INT is in the closed position. In other words, the microcontroller 70-2 measures the second voltage value V2 via the analog-to-digital converter 70-1.

In a step E4, the microcontroller 70-2 then calculates the value of the variable resistor RV by solving the system of two equations (I) on the basis of the value of the first digital value corresponding to the first voltage value V1 measured in step E1, of the second digital value corresponding to the second voltage value V2 measured in step E3, of the value of the voltage defined across the terminals of the voltage source Vcc and of the values of the first resistor R1 and of the second resistor R2.

The microcontroller 70-2 then determines the status of the communication link L2 on the basis of the value of the variable resistor RV in a step E5.

Solving the system (I) of two equations with two unknowns allows the uncertainty relating to the difference in voltage between the first ground M1 and the second ground M2 to be removed and thus the value of the variable resistor RV to be determined accurately without ever knowing the value of the first ground M1.

The switching means then control the switch INT so that it switches back to its open position in a step E6 and then the method begins again so as to diagnose the status of the communication link L2 anew.

The diagnostic method according to an aspect of the invention thus advantageously allows the status of the communication link L2 to be determined quickly, reliably and safely while using two different grounds for the compensator 6 and the diagnostic module 70.

The invention claimed is:

1. A method for diagnosing a status of a communication link between an interior relay antenna mounted in the passenger compartment of a motor vehicle and an exterior relay antenna mounted on a body of said motor vehicle, the status of said communication link being determined by a value of a voltage defined across terminals of a variable resistor that is connected both to an intermediate point of the communication link, located between the interior relay antenna and the exterior relay antenna, and to a first ground, said method being implemented by a diagnostic module comprising an electrical circuit including a midpoint that is connected to the interior relay antenna, a first resistor that is connected both to a voltage source and to said midpoint, and a capacitor that is connected both to the midpoint and to a second ground that is different from the first ground, the diagnostic module further comprising a second resistor that is linked to the midpoint of the electrical circuit and connected in series with a switch linked to the voltage source, the method comprising:
measuring a first voltage value defined between the midpoint of the electrical circuit and the second ground when the switch is in the open position;
measuring a second voltage value defined between the midpoint of the electrical circuit and the second ground when the switch is in a closed position;
calculating a value of the variable resistor from the first measured voltage value, from the second measured voltage value, from the value of a voltage defined across terminals of the voltage source and from the values of the first resistor and of the second resistor; and
diagnosing the status of the communication link on the basis of the calculated value of the variable resistor.

2. The method as claimed in claim 1, wherein the value of the variable resistor is calculated by solving a system of equations with two unknowns, which are the value of the voltage defined across the terminals of the variable resistor and the value of the difference in voltage between the first ground and the second ground according to the following equations:

$$V1 = V_{CC} \times \frac{RV}{R1 + RV} + (M1 - M2) \quad \text{(I)}$$

$$V2 = V_{CC} \times \frac{RV}{\frac{R1 \times R2}{R1 + R2} + RV} + (M1 - M2)$$

where:
RV is the value of the variable resistor,
Vcc is voltage of the voltage source,
V1 is the first voltage value defined between the midpoint of the electrical circuit and the second ground M2,
V2 is the second voltage value defined between the midpoint of the electrical circuit and the second ground M2,
R1 is the value of the first resistor,
R2 is the value of the second resistor,
M1 is the first ground, and
M2 is the second ground.

3. A diagnostic module configured to be mounted in a motor vehicle so as to diagnose a status of a communication link between an interior relay antenna mounted in the passenger compartment of said motor vehicle and an exterior relay antenna mounted on the body of said motor vehicle, the status of said communication link being determined by the value of a voltage defined across terminals of a variable resistor that is connected both to an intermediate point of the communication link, located between the interior relay antenna and the exterior relay antenna, and to a first ground, the diagnostic module comprising:
an electrical circuit including a midpoint that is configured to be linked to the interior relay antenna, a first resistor that is connected both to a voltage source and said midpoint, and a capacitor that is connected both to the midpoint and to a second ground that is different from the first ground;
an analog-to-digital converter, an input of which is connected to the midpoint of the electrical circuit; and
a microcontroller, an input of which is connected to an output of the analog-to-digital converter so as to receive a digital value corresponding to an analog voltage measured between the midpoint and the second ground,
a second resistor that is linked to the midpoint of the electrical circuit and connected in series with a switch linked to the voltage source; and
means for switching the switch between an open position and a closed position,
and wherein the microcontroller is configured to calculate the value of the variable resistor from a first digital value received from the analog-to-digital converter when the switch is in the open state, from a second digital value received from the analog-to-digital converter when the switch is in the closed state, from the value of the voltage defined across terminals of the voltage source and from the values of the first resistor and of the second resistor in order to diagnose the status of the communication link.

4. The diagnostic module as claimed in claim 3, wherein the microcontroller is configured to calculate the value of the variable resistor by solving a system of equations with two unknowns, which are the value of the voltage defined across the terminals of the variable resistor and the value of the difference in voltage between the first ground and the second ground according to the following equations:

$$V1 = V_{CC} \times \frac{RV}{R1 + RV} + (M1 - M2) \quad \text{(I)}$$

$$V2 = V_{CC} \times \frac{RV}{\frac{R1 \times R2}{R1 + R2} + RV} + (M1 - M2)$$

where:
RV is the value of the variable resistor,
Vcc is voltage of the voltage source,
V1 is the first voltage value defined between the midpoint of the electrical circuit and the second ground M2, V2 is the second voltage value defined between the midpoint of the electrical circuit and the second ground M2, R1 is the value of the first resistor, R2 is the value of the second resistor, M1 is the first ground, and M2 is the second ground.

5. The diagnostic module as claimed in claim 3, wherein the switch comprises a MOSFET transistor.

6. The diagnostic module as claimed in claim 5, wherein the switch comprises two Zener diodes that are connected via a common cathode, and the anodes of which are connected to a source and to a gate, respectively, of the transistor.

7. The diagnostic module as claimed in claim 5, wherein the switch comprises a diode, the anode of which is connected to a drain of a transistor and the cathode of which is connected to the source of the transistor.

8. The diagnostic module as claimed in claim 5, wherein the means for switching the switch comprise an AC voltage source that is connected between a source and a drain of the transistor.

9. The diagnostic module as claimed in claim 3, wherein the values of the first resistor and of the second resistor, and a maximum value of the variable resistor, are equal.

10. A motor vehicle comprising:

an interior relay antenna mounted in a passenger compartment of said motor vehicle;

an exterior relay antenna mounted on a body of said motor vehicle;

a communication link linking said interior relay antenna and said exterior relay antenna;

a variable resistor that is connected both to an intermediate point of a communication link, located between the interior relay antenna and the exterior relay antenna, and to a first ground, and a value of a voltage of which, defined across its terminals, allows a status of said communication link to be determined; and the diagnostic module as claimed in claim 3, the midpoint of which is linked to the interior relay antenna.

11. The diagnostic module as claimed in claim 4, wherein the switch comprises a MOSFET transistor.

12. The diagnostic module as claimed in claim 6, wherein the switch comprises a diode, the anode of which is connected to the drain of the transistor and the cathode of which is connected to the source of the transistor.

* * * * *